United States Patent
Di Stefano et al.

(10) Patent No.: US 8,816,700 B2
(45) Date of Patent: Aug. 26, 2014

(54) PORTABLE PARTIAL DISCHARGE DETECTION DEVICE

(75) Inventors: Antonio Di Stefano, Palermo (IT); Roberto Candela, Palermo (IT); Giuseppe Costantino Giaconia, Palermo (IT); Giuseppe Fiscelli, San Giuseppe Jato (IT)

(73) Assignee: Prysmian S.p.A., Milan (IT)

( * ) Notice: Subject to any disclaimer, the term of this patent is extended or adjusted under 35 U.S.C. 154(b) by 886 days.

(21) Appl. No.: 12/997,552

(22) PCT Filed: Jun. 11, 2009

(86) PCT No.: PCT/IB2009/052496
§ 371 (c)(1), (2), (4) Date: Mar. 14, 2011

(87) PCT Pub. No.: WO2009/150627
PCT Pub. Date: Dec. 17, 2009

(65) Prior Publication Data
US 2011/0156720 A1    Jun. 30, 2011

(30) Foreign Application Priority Data
Jun. 11, 2008 (IT) .............................. RM2008A0304

(51) Int. Cl.
*G01R 27/04* (2006.01)

(52) U.S. Cl.
USPC ............. 324/629; 324/95; 324/536; 324/544; 343/700 MS; 343/752; 343/846

(58) Field of Classification Search
USPC .......................................... 324/629; 343/846
See application file for complete search history.

(56) References Cited

U.S. PATENT DOCUMENTS

| | | | | | |
|---|---|---|---|---|---|
| 4,710,708 | A | * | 12/1987 | Rorden et al. | 324/207.26 |
| 4,763,130 | A | * | 8/1988 | Weinstein | 343/770 |
| 4,967,158 | A | * | 10/1990 | Gonzalez | 324/536 |
| 5,565,737 | A | * | 10/1996 | Keane | 315/111.21 |
| 5,903,158 | A | * | 5/1999 | Eriksson et al. | 324/536 |
| 5,903,159 | A | | 5/1999 | Miyata et al. | |

(Continued)

FOREIGN PATENT DOCUMENTS

| | | |
|---|---|---|
| EP | 0 955 550 A1 | 11/1999 |
| FR | 2 851 852 | 9/2004 |

OTHER PUBLICATIONS

International Search Report from the European Patent Office for International Application No. PCT/IB2009/052496 (Mail date May 3, 2010).

(Continued)

*Primary Examiner* — Benjamin M Baldridge
(74) *Attorney, Agent, or Firm* — Finnegan, Henderson, Farabow, Garrett & Dunner, L.L.P.

(57) ABSTRACT

A partial discharge detection device for detecting and measuring partial discharges in electric systems or components, which delivers signals having a form much resembling that of the radiated pulse, for improved identification and analysis. The device is of small size, totally insulated and self-powered, and allows measurements to be performed with the highest safety with no need for direct connection, thereby allowing operators to stand at a distance and avoid any system shutdown while making measurements. Furthermore, it can also detect and deliver the sync signal, which is obtained by picking up the supply voltage of the discharge generating components.

16 Claims, 3 Drawing Sheets

(56) References Cited

U.S. PATENT DOCUMENTS

| | | | | |
|---|---|---|---|---|
| 5,933,012 | A * | 8/1999 | Bengtsson et al. | 324/524 |
| 6,432,524 | B1 * | 8/2002 | Fromm et al. | 428/313.3 |
| 6,476,396 | B1 * | 11/2002 | Forsyth | 250/372 |
| 2002/0109497 | A1 * | 8/2002 | Brachat et al. | 324/95 |
| 2006/0007002 | A1 * | 1/2006 | Rastegar et al. | 340/556 |
| 2006/0145705 | A1 * | 7/2006 | Raja | 324/536 |
| 2006/0273971 | A1 * | 12/2006 | Connor | 343/752 |
| 2007/0024293 | A1 * | 2/2007 | Kosaka et al. | 324/750 |
| 2007/0229361 | A1 * | 10/2007 | Yanagi et al. | 343/700 MS |
| 2008/0061997 | A1 * | 3/2008 | Miyashita et al. | 340/646 |
| 2008/0079646 | A1 * | 4/2008 | Stuart | 343/795 |
| 2008/0122424 | A1 * | 5/2008 | Zhang et al. | 324/72 |
| 2009/0027062 | A1 * | 1/2009 | Maruyama et al. | 324/544 |
| 2009/0280581 | A1 * | 11/2009 | Hudson | 438/9 |
| 2010/0109959 | A1 * | 5/2010 | Coupez | 343/745 |
| 2011/0121839 | A1 * | 5/2011 | Gandois et al. | 324/629 |
| 2012/0262188 | A1 * | 10/2012 | Nickel et al. | 324/629 |

OTHER PUBLICATIONS

Wheeler, "The Radiansphere Around a Small Antenna," Proceedings of the IRE, Aug. 1959, pp. 1325-1331.

* cited by examiner

PORTABLE PARTIAL DISCHARGE DETECTION DEVICE

CROSS REFERENCE TO RELATED APPLICATION

This application is a national phase application based on PCT/IB2009/052496, filed Jun. 11, 2009, and claims the priority of Italian Patent Application No. RM2008A000304, the content of both of which is incorporated herein by reference.

FIELD OF THE INVENTION

The present invention relates to a portable partial discharge detection device, which is particularly used for detecting and measuring partial discharges in electrical components and apparatus, such as: medium or high voltage cables, cable joints, overhead line insulators, medium and high voltage switchboard boxes, high and extrahigh voltage cables using GIS (Gas Insulated Switchgear).

BACKGROUND ART

The term partial discharges is intended to indicate an undesired recombination of electric charges occurring in the dielectric (insulating) material of electric components, when the latter have defects of various types. Here, a pulse current is generated in portions of dielectric material, and causes an electromagnetic wave to propagate through the power or ground cables of the relevant electric system, and radiate through the various media through which this wave passes (dielectric Material, metals, air, etc.).

Partial discharges are usually measured by detecting the signals generated by such discharges using special sensors and analyzing such signals by suitable software. These sensors usually detect the discharges due to their propagation by conduction; therefore, they shall be fitted onto the cables or placed in the proximity of the components being measured, and often require temporary system shutdown. Such sensors include: dipole or dipole array antennas, "Rogowsky" or "coupler transformer" type magnetic sensors; electric or magnetic field proximity sensors, operating a few centimeters from the source; acoustic or piezoelectric sensors. All of these sensors are characterized by high performances in particular situations, but are not flexible enough to be used in any condition. An additional drawback is that the use of such sensors requires direct or mediated connection to the mains for assessment of the operating voltage phase at the discharge.

Prior art technology for radiated noise detection, which does not require direct connection to the system, includes electric or magnetic field sensors that utilize the principle of resonance for picking up signals of the highest amplitude, even without requiring any amplifier. The drawback of this kind of sensors consists in their signal processing difficulties, caused by resonance, concerning the form of acquired pulses.

Therefore, the need is felt for a partial discharge detection device that can overcome the above drawbacks.

SUMMARY OF THE INVENTION

A primary object of the present invention is to provide a partial discharge detection device for detecting and measuring partial discharges in source objects that generate such discharges, such as electric systems or components, which delivers signals having a form much resembling that of the radiated pulse, for improved identification and analysis.

A further object is to provide a device of small size, totally insulated and self powered, which allows measurements to be performed with the highest safety with no need for direct connection to the system under examination, thereby allowing operators to stand at a distance and not requiring the system to be deenergized for detection.

Therefore, the invention is aimed at fulfilling the above objects by providing a portable device for detecting partial discharges in a discharge source object which comprises, a wide-band antenna adapted to act as an electric field sensor and including a first planar conductor cooperating with a second conductor whose profile converges towards the first planar conductor at one point or one line, said second conductor being smaller by about two orders of magnitude than the field wavelength to be detected, so that the wide-band antenna is non-resonant in a band from about 0.1 MHz to about 100 MHz.

Advantageously, the device of the invention is electrically independent and portable and allows remote measuring of the components to be tested, with no galvanic connection and in a wholly safe manner.

This avoids any direct connection of sensors, which would require the system to be de-energized and later re-energized for detection, de-energized for removing sensors and de-energized again.

The signals that can be acquired by said device have increased amplitude due to the use of a series of amplifier stages.

The particular embodiments of the antenna of the inventive device have been found to be highly advantageous in the attainment of satisfactory results.

An additional advantage of the device of the present invention consists in the possibility of capacitively picking up the operating voltage, thereby providing a remote phase reference, without requiring any direct connection to the voltage. Therefore, it can also detect and deliver the sync signal, which is obtained by picking up the supply voltage of the discharge generating source object. This makes the device electrically independent and portable, and allows measurements to be made with no galvanic connection, by synchronizing the acquired pulses with the voltage that generated them.

The device may be connected to existing acquisition and analysis instruments, like conventional sensors.

The device may optionally include an electronic part for digital acquisition, analysis, display and storage and/or transmission of detected pulses. In this case, the device may be used as a full portable instrument. Thus, if the device is equipped with an acquisition and storage system, it can handle all information for traditional partial discharge measurement.

The form and size of the components have been designed for remotely picking up and faithfully reproducing the pulses generated by partial discharges.

The device of the invention may be also employed with medium voltage systems in fields such as wind power generation, railway traction, etc.

In spite of advantageously low manufacturing costs, performances are higher than prior art devices, and partial discharge detection times are shorter.

The dependent claims disclose preferred embodiments of the invention.

BRIEF DESCRIPTION OF THE FIGURES

Further characteristics and advantages of the invention will be more apparent from the detailed description of one preferred but non-exclusive embodiment of a partial discharge detection device which is described as a non-limiting example with the help of the annexed drawings, in which.

DETAILED DESCRIPTION OF PREFERRED EMBODIMENTS OF THE INVENTION

Figure 1:
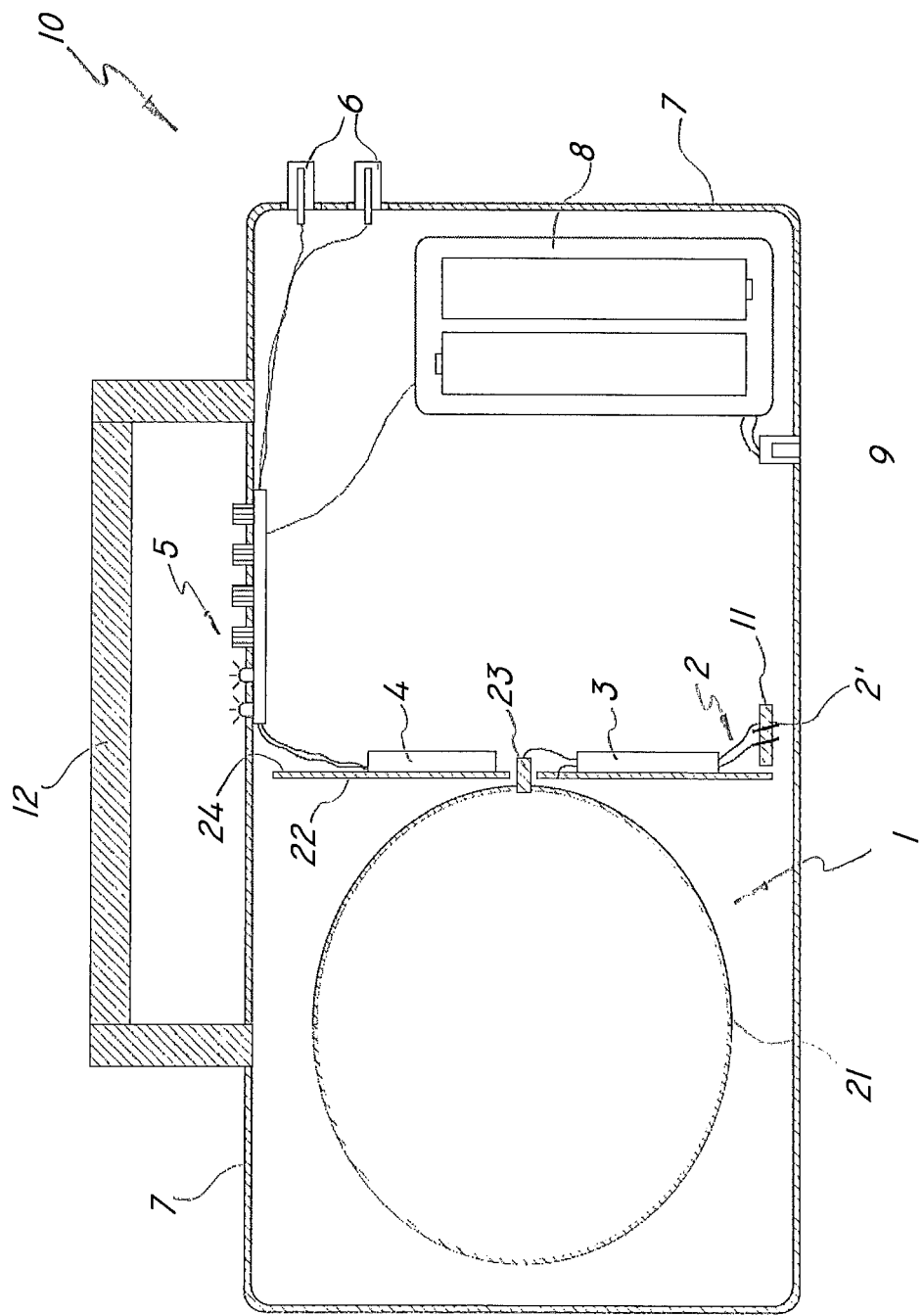
FIG. 1 is a sectional view of a partial discharge detection device of the invention.

Referring to FIG. 1, there is shown a partial discharge detection device, generally designated by numeral 10, which comprises:
- a non-resonant wide-band antenna 1, optimized for reception of the pulse signals generated by partial discharges,
- an auxiliary magnetic field sensor 2,
- an electronic wide-band amplifier 3,
- a synchronization circuit 4 for detecting the supply voltage of the system or component being examined by capacitive coupling,
- batteries 8 for supplying power to the circuits of the device,
- control means 5 for controlling its operation.

All these components are held in a portable container 7 having, for example, two BNC connectors 6, or other connectors suitable for picking up the detected signals, projecting therefrom for possible connection to existing acquisition or analysis instruments.

The wide-band antenna 1 is designed to be non-resonant in the relevant band from about 0.1 MHz to about 100 MHz. This ensures faithful reproduction of the detected pulses.

This feature is obtained by the use of a particular wide-band antenna 1 (an "Ultra-Wide Band" antenna) having special shape and size characteristics. Particularly, the antenna 1 comprises a first planar conductor 22, i.e. a ground plane, with a second conductor 21 placed above it at a short distance, which has such a shape that its profile converges at one point or one line towards the ground plane 22.

According to the selected shape, the second conductor 21 may be bi- or three-dimensional. Three-dimensional shapes are obtained from the bi-dimensional profile by rotation.

The ground plane 22, which preferably has a square or rectangular shape, has such a size as to contain at least the projection of the second conductor 21 over it. The first and second conductors 21, 22 are preferably formed of a conducting metal or polymer material.

The signal is picked up between the ground plane 22 and the point of the second conductor 21 that is closer to the plane 22.

Due to this configuration, the antenna 1 is non-resonant, while maintaining an adequate sensitivity, if the overall size of the antenna 1, and particularly the second conductor 21, is smaller by about two orders of magnitude than the wavelength of the relevant phenomena, which is, for instance, about 3-30 m. The antenna so constructed is particularly sensitive to electromagnetic fields having a frequency of the order of a few tens of MHz and, due to its non-resonant feature, it ensures highly faithful reproduction of the form of the received pulses.

Preferred embodiments of the antenna 1, based on the use of a circular or cusp-shaped profile, are shown in FIG. 2.

Figure 2D:
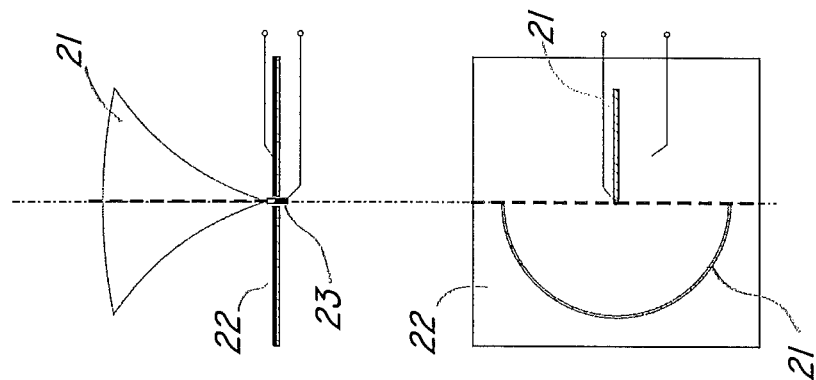
FIGS. 2a, 2b, 2c and 2d show two sectional and plan views respectively of embodiments of the electric field sensor component of the device of the invention.
Figure 2C:
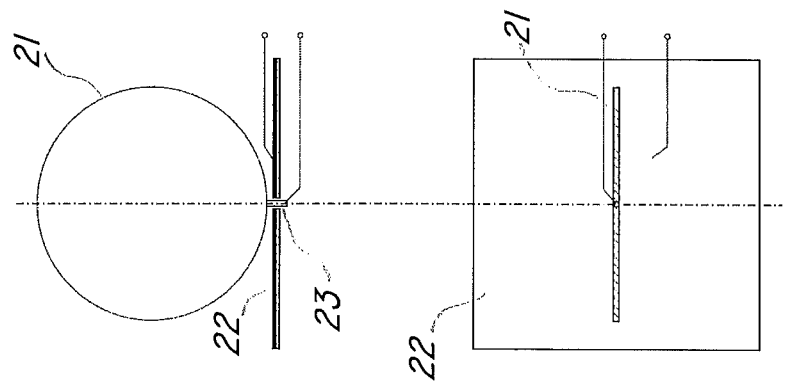
Figure 2B:
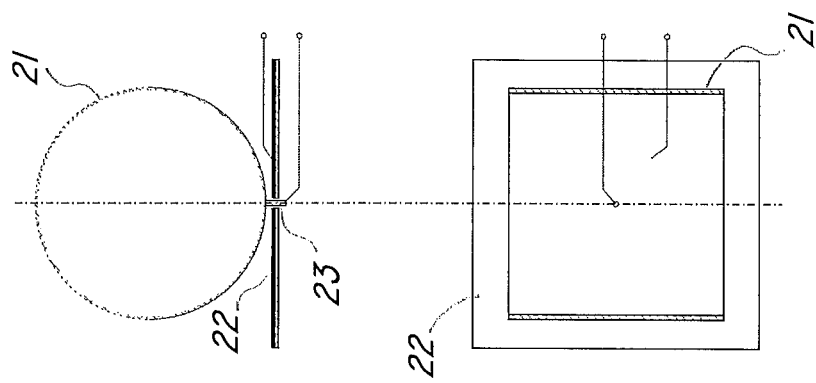
Figure 2A:
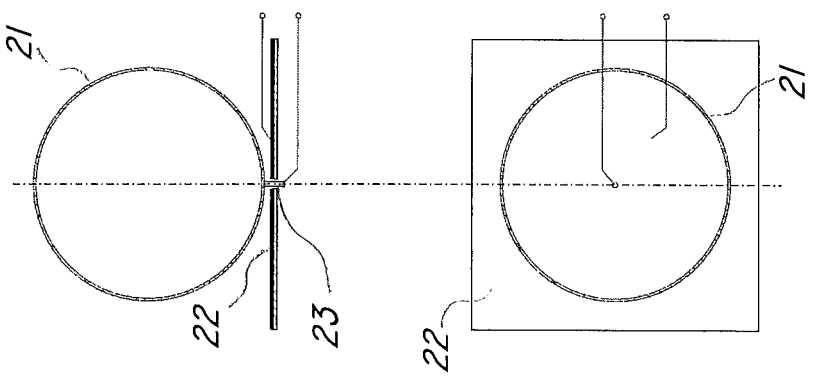

FIG. 2a shows an antenna with the second conductor 21 having the shape of a hollow sphere which has a diameter varying, for example, from 3 to 30 cm.

FIG. 2b shows an antenna with the second conductor 21 having the shape of a hollow half cylinder or, alternatively, a hollow cylinder (see the part outlined by broken lines), formed by extrusion. In this case, the diameter of the base of the cylinder varies, for example, from 3 to 30 cm.

FIG. 2c shows an antenna with the second conductor 21 having the shape of a disc which has a diameter varying, for example, from 3 to 30 cm.

FIG. 2d shows an antenna with the second conductor 21 having the shape of a flat cusp (right side of the plan view) or a rotational cusp (left side of the plan view), which has an opposite curvature relative to the profiles of the other variants. In these variants, the height of the cusp varies, for example, from 3 to 30 cm. In the case of the rotational cusp shape, the diameter of the conductor 21 in its section parallel and distal to the ground plane 22 also falls in the same range.

According to a preferred variant, the diameter of the second conductor 21, in the embodiments of FIGS. 2a, 2b and 2c falls in a range from about 5 to 20 cm. The second conductor 21 is placed at about 1 mm from the ground plane 22 which is at least as large as the second conductor 21.

The overall size of the wide-band antenna preferably is included within a volume of about 10×10×10 cm.

The second conductor 21 is mechanically supported in a position relative to the ground plane 22 by an insulated support 23 of adequate section, for instance about 2-3 mm$^2$, which also allows the signal of the second conductor to be picked up from the side of the surface 24 of the ground plane 22, i.e. the opposite side of said second conductor. The amplifier circuit may be located on said surface 24.

The antenna 1, which acts as an electric field sensor, may be connected in series with an auxiliary magnetic field sensor 2 comprising, for instance, at least one turn 2' wrapped around a high frequency ferrite rod 11 along its longitudinal extension. The turn 2' may be formed of a copper wire and the ferrite rod 11 around which it is wrapped has, for example, a longitudinal extension of about 5-10 cm.

This particular configuration allows the antenna 1 to receive electromagnetic pulse fields, even of weak strength, and to faithfully reproduce their form, unlike conventional antennas which are affected by resonance and distortion.

Figure 3A:
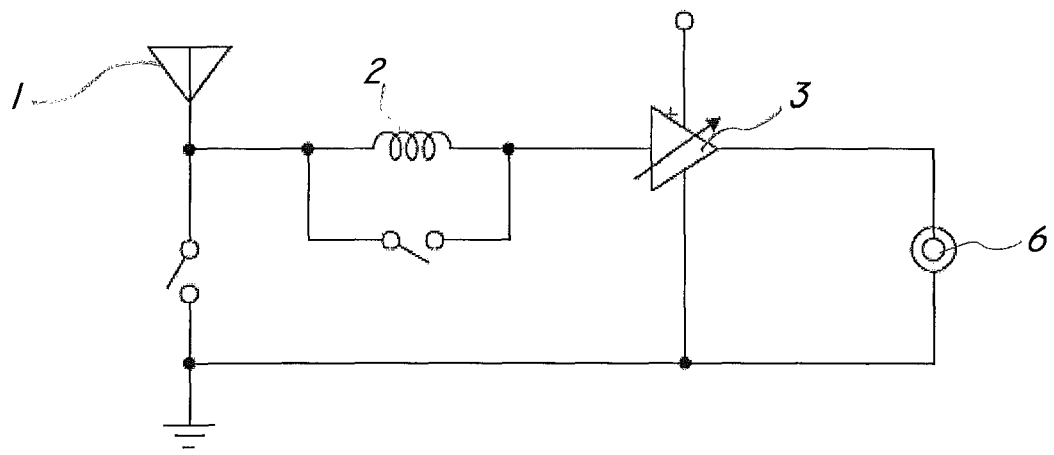
FIGS. 3a and 3b show parts of the electronic circuits of the device of the invention.

The auxiliary magnetic field 2 at the surface 24 of the ground plane 22 of the antenna 1, may be used in combination with or as an alternative to the antenna 1 to the extent that the magnetic component could or should be better assessed. Thus, the terminals of the antenna 1 or the sensor 2 can be short-circuited as needed using the control means 5. Each of the antenna or electric field sensor 1 and the magnetic field sensor 2 has a switch connected in parallel therewith, which may act as a short-circuit to bypass either of them, as shown in the diagram of FIG. 3a, which shows a part of the electronic amplifier circuit of the sensors 1 and 2.

The auxiliary magnetic field sensor 2 may be used to detect slower phenomena, having a band lower than 10 MHz, or for magnetic coupling to conducted signals running on cables or metal foils, by moving closer to them.

The electronic wide-band amplifier 3 operates by adjusting the impedance of the sensors 1 and 2 and amplifying the signals picked up by them for weak signal detection.

The output of the amplifier is led to a BNC connector 6 at one of the sides of the container 7. The amplifier 3 has a high input impedance, i.e. a few Kohm, and a low output impedance, typically 50 Ohm. It suitably increases the signal level by about 20-40 dB in the relevant band, possibly limited by filters. Amplification may be controlled using a potentiometer included in the control means 5.

The electronic wide-band amplifier 3 employs high-frequency operational transistors and/or amplifiers and is preferably characterized by a 20-30 dB gain and a minimum band preferably falling in a range from 0.5 MHz to 60 MHz. Off-band filtering is performed by first- and second-order filters, having a cut-off frequency of a few tens of MHz, and the maximum gain is user-adjustable.

The synchronization circuit 4 is an electronic high impedance circuit capable of capacitively detecting, remotely and with no galvanic coupling, the AC voltage supplied to the electronic component being measured, which generates pulse phenomena. This allows synchronization of the detected pulses with the voltage that generates them.

This synchronization circuit 4 comprises a part made of conducting material 20, which is used for capacitive coupling to the field, and is obtained from one of the conductors 21, 22 of the antenna 1 or from the case or container 7 of the device, if it is formed of a conducting material. This part 20 is connected to an additional high-impedance (>1 Mohm) and high gain amplifier, followed by a low-frequency filter (having a frequency of 50, 60 Hz, or the first harmonics thereof) and/or a phase-locked loop, such as a PLL circuit, which is synchronized with the detected electromagnetic field.

The field signal so picked up and amplified may be filtered for noise or interference reduction. For this purpose, the filters or PLL circuits are constructed using analog or digital circuits. In the latter case, the circuit may also provide indications about the state or quality of synchronization. The sync signal, so obtained at the output of the synchronization circuit 4 is externally delivered via a second BNC connector 6 on one side of the container 7.

Figure 3B:
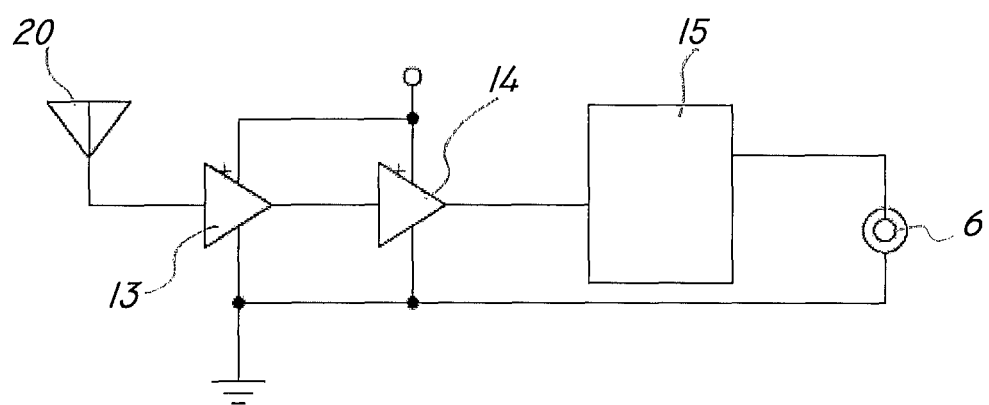

In a preferred variant, the synchronization circuit 4 employs two operational amplifiers 13, 14 to obtain high gain and high input impedance, as shown in FIG. 3b, which illustrates a part of the electronic synchronization circuit.

The signal is processed by a microcontroller-based digital circuit 15 which implements a digital PLL whereof the user may set the oscillation frequency, the band and the phase of the output wave.

The container 7, which may be made of a metal or plastic material, has an overall size that allows it to be easily portable and also comprises:
- a compartment for the batteries 8 that supply power to the circuits,
- control means 5 for selecting the desired operating mode,
- a handle 12 for facilitating transport and orientation during measurements.

The batteries 8 may be rechargeable AA batteries, having an external charging connector 9 to avoid opening of the container 7 for replacement, while ensuring better protection of the device from external agents. The control means 5 include a power switch, gain controlling potentiometers, a switch for bypassing the electric and magnetic field sensors, LEDs for indicating the operating state and the synchronization level attained. The detected electromagnetic pulse and the sync signal, which may be transmitted to any acquisition or analysis instrument, is delivered at the output via special connectors, such as BNC connectors 6. The device so obtained may be connected to any acquisition system having a sufficient passband, such as an oscilloscope, acquisition cards, partial discharge monitoring systems, etc. Optionally, the device of the invention may include an electronic circuit for acquisition, processing, storage and/or transmission, which contains an analog-to-digital converter, a microprocessor and/or a programmable logic, a flash memory for data storage, a data display and an interface (e.g. USE, Ethernet, Bluetooth, WiFi, etc.) for connection to a PC. In this case, the device can acquire, process and store the detected data, and provide real-time and possibly remote indications about such data and may be used as an independent portable instrument, adapted for on-site measurements and continuous monitoring of the electric systems or components being examined.

The invention claimed is:

1. A portable device for remotely detecting partial discharges in a discharge source object, the portable device comprising:
   a housing or portable container for the portable device;
   a wide-band antenna that operates as an electric field sensor for reception of pulse signals generated by partial discharges, contained in the housing;
   wherein the wide-band antenna comprises a combination of a first planar conductor with a second conductor, wherein the second conductor comprises a profile converging toward the first planar conductor at one point or along a line, wherein the dimensions of said second conductor are smaller by approximately two orders of magnitude than a wavelength of the electric field caused by the partial discharge to be detected by the wideband antenna, wherein the first planar conductor functions as a ground plane, and wherein the second conductor is mechanically supported by an insulated support to allow the electric field wavelength to be detected to be picked up from a surface of the first planar conductor opposite to the second conductor, so that the wide-band antenna is non-resonant in a band from approximately 0.1 MHz to approximately 100 MHz.

2. The device as claimed in claim 1, wherein the first planar conductor has a size such as to contain at least the projection of the second conductor over the first planar conductor.

3. The device as claimed in claim 1, wherein the second conductor has a three-dimensional non-planar shape.

4. The device as claimed in claim 3, wherein the second conductor has a shape of a hollow sphere or a hollow half cylinder or a hollow cylinder or a rational cusp.

5. The device as claimed in claim 1, wherein the second conductor has a bi-dimensional shape.

6. The device as claimed in claim 5, wherein the second conductor has a shape of a disk or a flat cusp.

7. The device as claimed in claim 4, wherein the second conductor has a diameter or a height from 3 to 30 cm.

8. The device as claimed in claim 1, wherein an auxiliary magnetic field sensor is connected in series with said wide-band antenna.

9. The device as claimed in claim 8, wherein a wide-band amplifier is provided for adjusting the impedance of the wide-band antenna and/or the auxiliary magnetic field sensor, and for amplifying the received signal.

10. The device as claimed in claim 9, wherein said wide-band amplifier comprises high-frequency transistors and/or amplifiers.

11. The device as claimed in claim 9, comprising control means including a potentiometer for controlling the amplification of said electronic wide-band amplifier.

12. The device as claimed in claim 11, wherein said control means also short-circuits the terminals of the wide-band antenna or the auxiliary magnetic field sensor.

13. The device as claimed in claim 9, wherein a synchronization circuit is provided for detecting the supply voltage of the source object by capacitive coupling, to synchronize the detected signals with the voltage that generates said detected signals.

14. The device as claimed in claim 13, wherein two BNC connectors are provided at the outside of the housing, to supply the output signal of the wide-band amplifier and the output signal of the synchronization circuit, respectively.

15. The device as claimed in claim 1, wherein an electronic circuit is provided for acquisition, processing and storage and/or transmission of an acquired signal or signals.

16. The device as claimed in claim 15, wherein all components are housed in a portable container or housing, which comprises a compartment for batteries that supply power to the circuits.

\* \* \* \* \*